United States Patent [19]
Robinson

[11] Patent Number: 6,072,944
[45] Date of Patent: Jun. 6, 2000

[54] METHODS AND APPARATUS FOR DISTRIBUTED PROCESSING AND RAPID ASIC DEVELOPMENT

[75] Inventor: Jeffrey I. Robinson, New Fairfield, Conn.

[73] Assignee: IQ Systems, Inc., Sandy Hook, Conn.

[21] Appl. No.: 08/683,625

[22] Filed: Jul. 17, 1996

Related U.S. Application Data

[63] Continuation-in-part of application No. 08/525,948, Sep. 8, 1995, Pat. No. 5,708,838, which is a continuation-in-part of application No. 08/545,881, Oct. 20, 1995, Pat. No. 5,687,326, which is a continuation-in-part of application No. 08/645,262, May 13, 1996, Pat. No. 5,922,061.

[51] Int. Cl.[7] .................................................. G06F 11/22
[52] U.S. Cl. ..................................................... 395/500.05
[58] Field of Search .............................. 395/800.28, 683, 395/500.05; 714/31; 712/227

[56] References Cited

U.S. PATENT DOCUMENTS

| | | | |
|---|---|---|---|
| 4,050,097 | 9/1977 | Min et al. ................................. | 364/200 |
| 4,200,936 | 4/1980 | Borzcik et al. .......................... | 364/900 |
| 4,357,658 | 11/1982 | van der Ouderaa .................... | 364/200 |
| 4,488,226 | 12/1984 | Wagner, Jr. et al. .................... | 364/200 |
| 4,791,550 | 12/1988 | Stevenson et al. ...................... | 364/200 |
| 5,036,459 | 7/1991 | den Haan et al. ....................... | 364/200 |
| 5,095,522 | 3/1992 | Fujita et al. ............................. | 395/200 |
| 5,165,018 | 11/1992 | Simor ....................................... | 395/300 |
| 5,276,807 | 1/1994 | Kodama et al. ......................... | 395/200 |
| 5,345,550 | 9/1994 | Bloomfield .............................. | 395/156 |
| 5,361,376 | 11/1994 | Cummins et al. ....................... | 395/800 |
| 5,384,911 | 1/1995 | Bloomfield .............................. | 395/157 |
| 5,398,336 | 3/1995 | Tantry et al. ............................. | 395/614 |
| 5,410,723 | 4/1995 | Schmidt et al. ......................... | 395/800 |
| 5,430,850 | 7/1995 | Papadopoulos et al. ................ | 395/375 |
| 5,471,619 | 11/1995 | Messina .................................. | 395/608 |
| 5,550,976 | 8/1996 | Henderson et al. ..................... | 709/201 |

OTHER PUBLICATIONS

Lonworks Products Motorola Master Selection Guide Revision 7, 2nd quarter 1994 pp. 2.6–2 through 2.6–7.
"Intel i960 RP sports PCI–to–PCI bridge", by Wirbel, EE Times, Jun. 19, 1995.

*Primary Examiner*—John A. Follansbee
*Attorney, Agent, or Firm*—David P. Gordon; David S. Jacobson; Thomas A. Gallagher

[57] ABSTRACT

The invention provides a distributed processing system having a host processor and one or more object oriented processors which are embodied as discrete components and as a collection of components on a single ASIC chip. A high level command language and a communications bus system are also provided both for use with discrete components and as an integral part of an ASIC chip. The ASIC chips are premanufactured to operate identically to a corresponding collection of discrete components. A distributed processing system is developed by coupling a collection of discrete object oriented processors and a host processor to a bus and writing a command language script to define the functionality of the system. After the system is designed and tested using discrete components, a suitable premanufactured ASIC or collection of ASICs is chosen and coupled to a host processor. The high level command language script permits the host processor and the ASIC system to perform identically to the discrete component system. An addressing scheme is provided in the command language such that multiple object orient processors may be given a single simultaneous command. Object oriented processors may have child ports with soft addressability to which other object oriented processors may be coupled. The child ports with soft addressability have software assignable addresses.

6 Claims, 5 Drawing Sheets

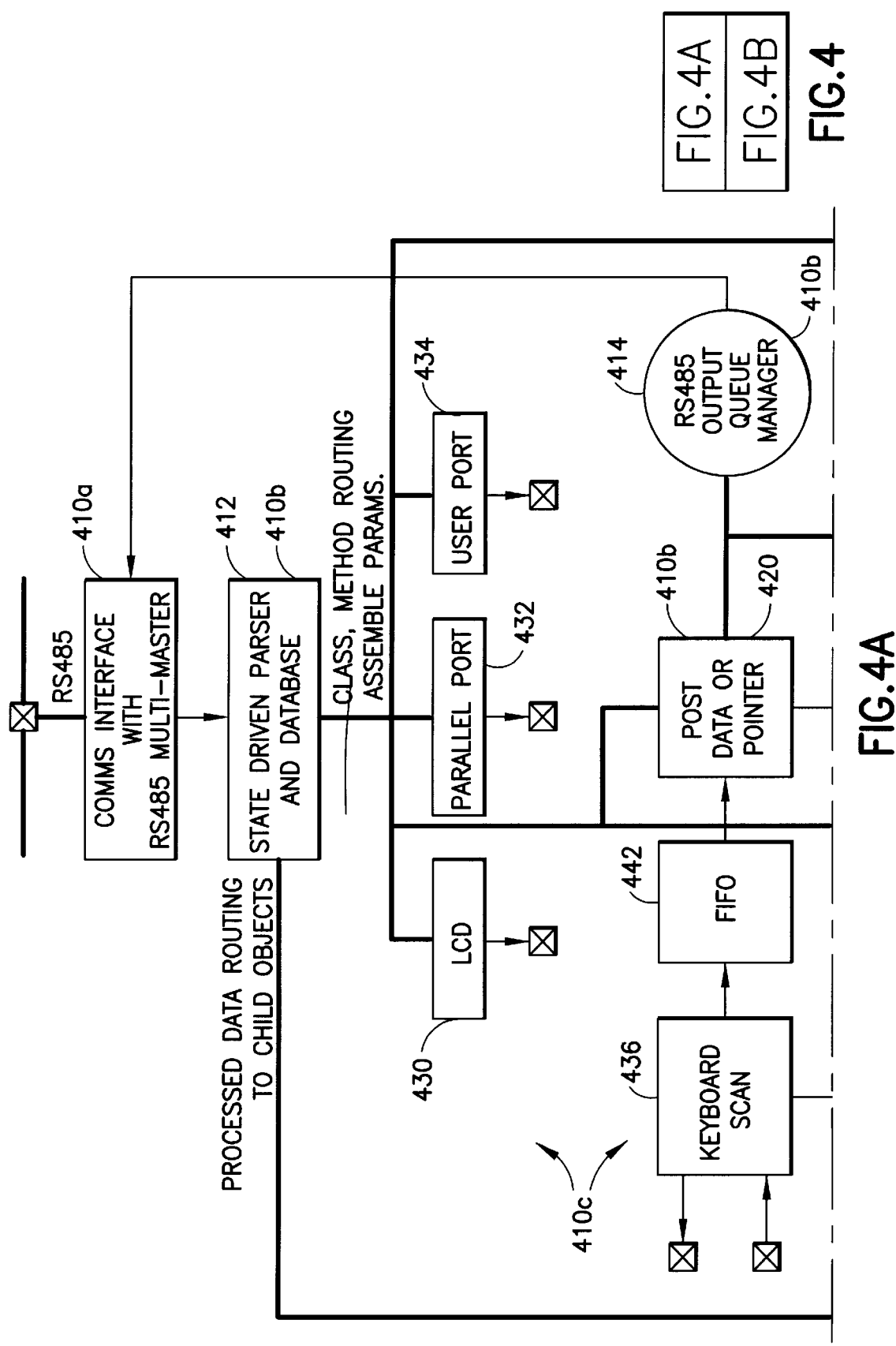

METHODS AND APPARATUS FOR DISTRIBUTED PROCESSING AND RAPID ASIC DEVELOPMENT

This application is a continuation-in-part of application Ser. No. 08/525,948 filed Sep. 8, 1995, now U.S. Pat. No. 5,708,838, application Ser. No. 08/545,881 filed Oct. 20, 1995, now U.S. Pat. No. 5,687,326, and application Ser. No. 08/645,262 filed May 13, 1996, now U.S. Pat. No. 5,922,061, the complete disclosures of which are hereby incorporated by reference herein.

BACKGROUND OF THE INVENTION

1. Field of the Invention

The invention relates to distributed processing systems. More particularly, the invention relates to a distributed processing system wherein discrete components communicate via a high level language such that functional systems may be rapidly developed and reduced to an ASIC implementation without the timing and electrical problems usually associated with ASIC development

2. State of the Art

Application Specific Integrated Circuits (ASICs) are widely used to implement sophisticated circuits for mass production. ASICs are developed in a number of different ways. One approach is to construct a prototype using discrete components wired together on a bread board or an etched circuit board, test and debug the prototype, and then migrate the circuit to an ASIC implementation. This approach has the advantage that the concept of the circuit is proven prior to ASIC implementation. A significant disadvantage of this approach is that the ASIC implementation utilizes very low level building blocks (e g., individual gates and registers) on a single chip which perform differently than the discrete components used in the prototype. The differences in performance of the on-chip components manifests itself in timing differences, parasitic capacitance, power balancing requirements, etc. Moreover, given the differences between the ASIC components and the prototype components, the mapping of the prototype to an ASIC chip may not be an optimal or even feasible implementation. Substantial redesign may be required during the migration to ASIC and the redesign introduces additional risk that the circuit will not perform as desired.

Another popular approach to ASIC design is to simulate a circuit using computer software which relies on a cell library supported by the ASIC manufacturer. Although this approach also involves careful attention to timing and the electrical characteristics of the final chip, there is greater confidence that the final chip will perform in the same manner as the simulated circuit. Nevertheless, software simulation is not always an accurate substitute for a real world prototype. The concept of the circuit is not tested in real world conditions until after the ASIC prototype is delivered, i.e. after a significant investment of time and money. Although the ASIC may perform according to the specifications of the software simulation, it may not be completely functional if the specifications are incorrect for a real world application. The development of an accurate specification for a real world circuit without any hardware testing is difficult and time consuming.

In most of the approaches to ASIC design and manufacture, once the circuit is reduced to an ASIC chip it cannot be easily and efficiently modified without redesigning a new chip. While there do exist field programmable gate arrays (FPGAs), these devices are too inefficient, because of their large die size, for higher volume applications.

SUMMARY OF THE INVENTION

It is therefore an object of the invention to provide methods and apparatus for rapid ASIC development.

It is also an object of the invention to provide methods and apparatus for rapid ASIC development which avoids the timing and electrical problems typically associated with ASIC development.

It is another object of the invention to provide methods and apparatus for distributed processing which includes tools for rapid reconfiguration of a distributed processing system without requiring any hardware modification.

It is still another object of the invention to provide methods and apparatus for rapid ASIC development wherein the functionality of the ASIC chip can be easily and efficiently reconfigured after fabrication through the use of software commands.

In accord with these objects which will be discussed in detail below, the present invention draws on aspects of the parent applications to provide methods and apparatus for ASIC design. In addition, the invention provides enhancements to the technology of the parent applications which allows for rapid reconfiguration of a distributed processing system without requiring any hardware modification. Accordingly, the invention provides methods and apparatus for "post-fabrication optimization" of ASIC chips.

The apparatus of the invention therefore provides a distributed processing system having a host processor and one or more object oriented processors which are embodied as discrete components and as a collection of components on a single ASIC chip. A high level command language and a communications bus system are also provided both for use with discrete components and as an integral part of an ASIC chip. The ASIC chips according to the invention are premanufactured to operate identically to a corresponding collection of discrete components. According to the methods of the invention, a distributed processing system is developed by coupling a collection of discrete object oriented processors and a host processor to a bus according to the invention and writing a command language script to define the functionality of the system. After the system is designed and tested using discrete components, a suitable premanufactured ASIC or collection of ASICs is chosen and coupled to a host processor using the same bus structure as the discrete component system. The high level command language script permit the host processor and the ASIC system to perform identically to the discrete component system.

The methods of the invention also provide an addressing scheme in the high level command language such that multiple object orient processors may be given a single simultaneous command. In addition, the apparatus of the invention provides "parent" object oriented processors which have one or more child ports with soft addressability to which other "child" object oriented processors may be coupled. The child ports with soft addressability have software assignable addresses and the address of an addressable port may be changed using the high level command language. The "virtual address" of each child processor can therefor be changed at any time without any change in the hardware of the distributed processing system. The methods of the invention further include device interrogation wherein the host determines the functionality of each of the object oriented processors via a command, functional grouping of the object oriented processors by the host through the assignment of virtual addresses, and reconfiguration of the parameters of object oriented processors by the host via commands.

Utilizing the methods and apparatus of the present invention, distributed processing systems can be constructed using discrete components, the functionality of the system defined using the high level command language, the topology and functionality of the system altered through the use of virtual addressing, and the entire system replicated on one or more ASIC chips which function identically to the discrete component system. In addition, the functionality of the system as embodied on one or more ASIC chips may be further altered using the high level command language without the need to modify any of the hardware.

Preferred aspects of the invention include: providing the command language with three types of messages (commands, responses, and exceptions); providing an interrupt character for use by object oriented processors when sending unsolicited messages; and defining the interrupt character and message delimiting characters to take advantage of the bus characteristics so that contention can be resolved according to a priority scheme. Additional objects and advantages of the invention will become apparent to those skilled in the art upon reference to the detailed description taken in conjunction with the provided figures.

DETAILED DESCRIPTION OF THE PREFERRED EMBODIMENTS

Figure 1:
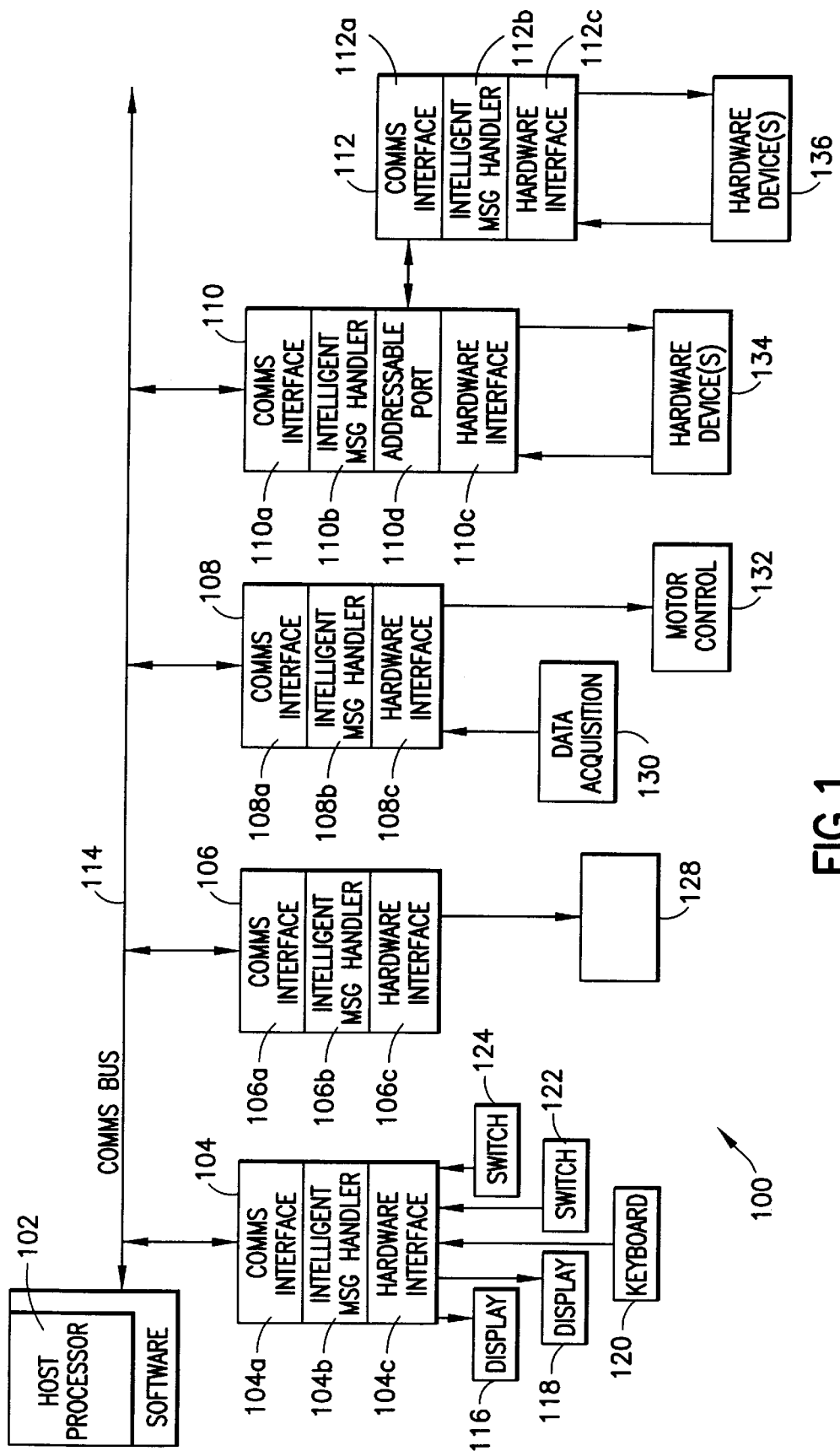
FIG. 1 is a schematic block diagram of a distributed processing system according to the invention in which peripheral devices are coupled to a host processor via a communications channel and discrete object oriented processors.

Referring now to FIG. 1, an exemplary development system 100 according to the invention includes a host processor 102, and a plurality of object oriented processors 104, 106, 108, 110 which are coupled to the processor 102 via a communication bus 114. Preferably, the bus 114 utilizes one of the "zero-dominant" protocols described in parent application Ser. No. 08/545,881 filed Oct. 20, 1995, now U.S. Pat. No. 5,687,326, or parent application Ser. No. 08/645,262 filed May 13, 1996, now U.S. Pat. No. 5,922,061.

Each of the object oriented processors 104, 106, 108, 110 includes a Comms interface 104a, 106a, 108a, 110a an intelligent message handler 104b, 106b, 108b, 110b and an functional layer which in the examples shown is a hardware (peripheral) interface 104c, 106c, 108c, 110c. In accord with the invention, however, the functional layers need not be hardware related, but could be a processing routine. Each object oriented processor 104, 106, 108 110 is bidirectionally coupled via its respective Comms interface 104a, 106a, 108a, 110a to the communication bus 114 which is coupled to the host processor 102. This system is substantially the same as the system described in parent application Ser. No. 08/525,948 but for the object oriented processor 110 which includes an addressable port 110d through which another object oriented processor 112 is coupled. The object orient processor 112 is similar to the object oriented processors 104, 106, 108 and is provided with a Comms interface 112a, an intelligent message handler 112b, and a functional layer 112c. As described in more detail below, a high level command language is provided for communication among the host and the object oriented processors 104, 106, 108, 110, 112.

As shown in FIG. 1, each of the exemplary object oriented processors 104, 106, 108 is designed to support different types of peripherals.

The first object oriented processor 104 (which is described in detail in the parent application) has the task of a universal front panel controller (a user interface controller). It is designed to support peripheral devices such as LED/LCD alphanumeric displays 116, 118, a keypad or keyboard 120 (which is actually a matrix of switches), and several rotary encoders or switches 122, 124. As such, the hardware interface 104c is specifically designed to accommodate these peripheral devices. Moreover, the intelligent message handler 104b of this object oriented processor 104 need only respond to messages appropriate for the types of peripherals serviced by it.

The second object oriented processor 106 (which is described in detail in the parent application) is a speech messaging controller and is designed to support a digital-to-analog converter 128. Consequently, the hardware interface 106c is specifically designed to accommodate these peripheral devices. Moreover, the intelligent message handler 106b of this object oriented processor 106 need only respond to messages appropriate for the types of peripherals serviced by it.

The third object oriented processor 108 (which is described in detail in the parent application) has the task of an analog interface and is designed to support analog data acquisition devices 130 and pulse width modulation controlled analog devices such as power supplies and motor controls 132. As such, the hardware interface 108c is specifically designed to accommodate these peripheral devices. Moreover, the intelligent message handler 108b of this object oriented processor 108 need only respond to commands appropriate for the types of peripherals serviced by it.

The object oriented processor 110 (which is described in detail below) has the task of routing messages to and from the object orient processor 112, as well as supplying its own functionality such as supporting hardware device(s) 134. The object oriented processor 112 may be the same as any one of the processors 104, 106, 108.

According to the present invention, an enhanced command language is provided wherein messages are prioritized and addressed and may be multi-cast to several object oriented processors.

According to a presently preferred embodiment of the invention, the high level command language includes three distinct message types: {command}, [response], and (exception), where the delimiting braces "{ }", brackets "[ ]", and parenthesis "()" designate the type of message contained therebetween.

The presently preferred format of a command message can be either {toAddr fmAddr function parameters~checksum) or (start:end fmAddr function parameters~checksum}.

"toAddr" is an optional one byte (two hex characters) address of the intended recipient. If no recipient address is given, the command is a global command which is interpreted by all other processors in the system. According to a presently preferred embodiment, address codes may use digits 0 through 9 and lower case letters a through f and the address 00 is reserved for the host.

"start:end" represents a range of addresses which is optional in lieu of a single recipient address.

"fmAddr" is a two character mandatory sender address and, according to the presently preferred embodiment, 00 is the reserved address for the host processor.

"function" is a mandatory two character code. According to a presently preferred embodiment, the first character of a function is always an upper case letter and the second character may be an upper case letter or a digit 0–9. It will be appreciated that the change in character case between the address fields and the function field serves as an effective delimiter of these fields.

"parameter" is an optional field of arbitrary length depending on the function called. According to a presently preferred embodiment, any reserved characters used in the parameter field are literalized using the "\" character.

"~" indicates the start of an optional checksum.

An example of a global command is {00ZZ} by which the host sends a soft reset to all of the object oriented processors. An example of a command addressed to a range of addresses is {08:1400PSA00A02} which is sent from the host to object oriented processors at addresses 8 through 14 inclusive calling the function PS with the parameter string A00A02. The same command could be sent with a checksum in which case, the message would be {08:1400PSA00A02~C9}. The checksum value is calculated for all of the characters to the left of the tilde.

Response messages have the syntax [toAddr fmAddr data~checksum] or [interpid fmAddr data~checksum]. The first form of a response message is used when responding to a specific command and the second form is used when sending an unsolicited response, e.g. when sending data from an input device. The data field is optional and of arbitrary length. Any reserved characters used in the data field are literalized using the "\" character. The tilde indicates the start of a checksum. The starting field "interpid" indicates an unsolicited message and takes the form !s where s is a hex character indicating the internal source of the message within the sending processor. Unsolicited messages are interrupt driven as described in more detail below. An example of an unsolicited response message is [!503FE56~0A] where data FE56 is sent from source at address 5h in the processor at address 03h. As mentioned above, the address 00h is reserved for the host. An unsolicited response message may typically be generated by a processor which is coupled to an input device. For example, the processor 104 in FIG. 1 would generate an unsolicited message in response to a keypress on the keyboard 120, or in response to one of the switches 122, 124 being switched. The internal source ID carried in the unsolicited message would indicate whether the data was generated at the keyboard 120, the switch 122, or the switch 124. It will be appreciated that the unsolicited messages do not contain a recipient address so that any processor interested in the message can interpret it. An example of a solicited response message is [0003FE56] where the data FE56 is sent from the processor at address 03 to the host in response to some command from the host. For example, the processor 104 in FIG. 1 would generate a solicited message in response to a keypress on the keyboard 120 following a command from the host to display a prompt gon display 116 or 118 for a user to enter a keypress. As with the command messages, the checksum field is optional in response messages.

Exception messages have the syntax (toAddr fmAddr errNo~checksum). Both address fields are mandatory. The errNo field is a hex coded error message and the checksum field is optional. According to the presently preferred embodiment, exception messages are not returned in response to global or multicast command messages in order to simplify flow control.

From the foregoing, it will be appreciated that any processor in the system 100 shown in FIG. 1 can send a command to any other processor in the system and that the multicast form of messages allows a processor to send a single command to a group of processors. For example, in response to activation of the switch 122, the processor 104 could be programmed to send a command to the processor 108 to effect a change in the motor control 132; or data acquired at 130 could be sent by the processor 108 to the processor 104 for display on the display 118. In addition, when the system is designed, the designer may choose to allocate addresses of similar processors in a contiguous range so that a single command, to display a prompt, for example, is multicast to be interpreted by all the processors capable of displaying the prompt.

The choice of message delimiters and the interrupt flag is not arbitrary. When using a zero-dominant bus protocol, there is an inherent priority structure. The lower the ASCII value of the delimiter or flag, the higher its priority. Thus, commands, which are delimited by braces { }, have a lower priority than responses, which are delimited by brackets [ ], which in turn have a lower priority than exceptions which are delimited by parentheses ( ) The interrupt flag ! has the highest priority.

According to the presently preferred embodiment, a plurality of predefined object oriented processors are provided for use by a developer. Each of the predefined processors has a specific functionality or functionality set and an address which is assigned at boot time. As discussed in the parent application, the presently preferred manner of constructing object oriented processors is by way of a virtual machine. That is, a general purpose processor is programmed to behave in a specific manner in response to commands from the high level language and to generate responses and exceptions in response to commands and in response to other events such as input events from a connected peripheral. Accordingly, the presently preferred object oriented processors are embodied as general purpose processors with a ROM program. However, from the discussion herein and in the parent applications, those skilled in the art will appreciate that the functionality of an object oriented processor can be achieved with any mixture of hardware and software. Generally, functionality which needs to be available in parallel with other functionality will require additional hardware; and functionality which can be available in series can be achieved with additional software. In addition, according to the invention, a developer may create unique object oriented processors which understand the high level command language of the invention.

As mentioned above, the addressable port in processor 110 is designed to allow for soft address allocation during operation of the system. That is, the "virtual address" of the port 110d in processor 110 can be changed by any of the other processors using a command function. The virtual address of the port 110d will then be the "effective address" of the processor 112. The link between the addressable port of a parent processor 110 and a child processor 112 utilizes a point to point link where addressing is not an issue. The virtual address of the child processor 112 is stored by the parent processor 110 in a database as described in more detail below. For example, assuming that the processor 110 has the address "10", the addressable port 110d is assigned the address "12", and the processor 104 has the address "04", a message from the child processor 112 to the processor 106 will take the form {06PSA08A09} as it is received by the parent processor 110. The parent processor will insert the virtual from address of the child processor before sending the message to the bus in the form {0612PSA08A09}. Similarly, a message from the processor 106 to the processor 112 will take the form {1206PSA08A09}. Processor 106 will place the message on the bus and the processor 110 will recognize it as destined for the addressable port 110d. The processor 110 will then strip off the virtual address of the child processor 112 forward the message in the form {06PSA08A09} to the processor 112. While the processor 110 has been shown with one addressable port, the invention contemplates providing a processor with several child ports with soft addressability.

According to a presently preferred embodiment of the invention, the command to set a virtual address takes the form {toAddr fmAddr ZPpqrs} where the parameter pq identifies which addressable port of the processor is to be assigned the soft address and the parameter rs is the soft address.

This soft addressing feature of the system taken together with the range addressing feature allows the system to regroup processors for multicast commands in response to changes in the system during operation as described in more detail below.

Figure 2:
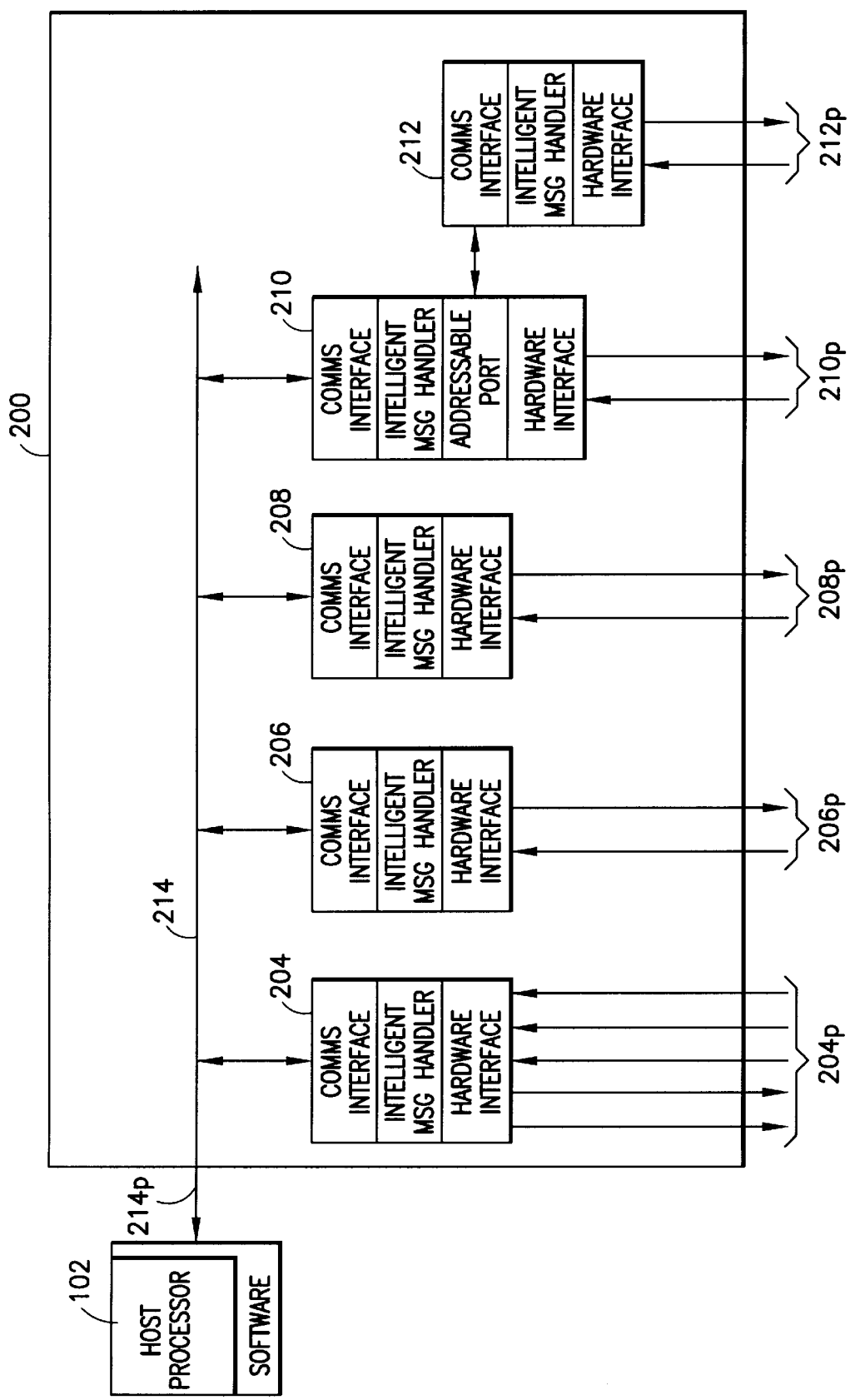
FIG. 2 is a schematic block diagram of a distributed processing system according to the invention in which peripheral devices are coupled to a host processor via a communications channel and object oriented processors embodied on an ASIC chip.

Turning now to FIGS. 1 and 2, according to the methods of the invention, functionally identical equivalents of the object oriented processors of the discrete system of FIG. 1 are embodied on an ASIC chip to which the system is easily migrated after its full functionality is defined using the host processor. For example, as shown in FIG. 2, an ASIC chip 200 includes the functional equivalent 204 of the processor 104 of FIG. 1, the functional equivalent 206 of the processor 106, the functional equivalent 208 of the processor 108, the functional equivalent 210 of the processor 110, and the functional equivalent 212 of the processor 112. Moreover, the functional equivalent processors are coupled to each other in a functionally equivalent manner with an on-chip bus 214 (which need only be as fast as the discrete bus) which is accessible off the chip via pins 214p shown schematically in FIG. 2. To the extent that the functionally equivalent processors require connection to external peripherals, additional pins 204p, 206p, 208p, 210p, 212p are provided on the chip as shown schematically in FIG. 2.

Thus, one method of developing an ASIC according to the invention includes selecting from a library of discrete object oriented processors to develop an implementation and selecting from a library of ASIC chips each of which embodies a plurality of object oriented processors. The developer designs and tests the system using discrete object oriented processors and then chooses an appropriate ASIC which embodies the object oriented processors necessary for the designed system. Since the ultimate functionality of the system is based on the high level command language, the functionality of the bus, and the choice of which kind of object oriented processors to use, the functionality of the ASIC system will be identical to the discrete component system. The ultimately selected ASIC may actually have more object oriented processors embodied on it than necessary for the application. Nevertheless, this method is cost effective because the ASICs are an off-the-shelf item.

Figure 3:
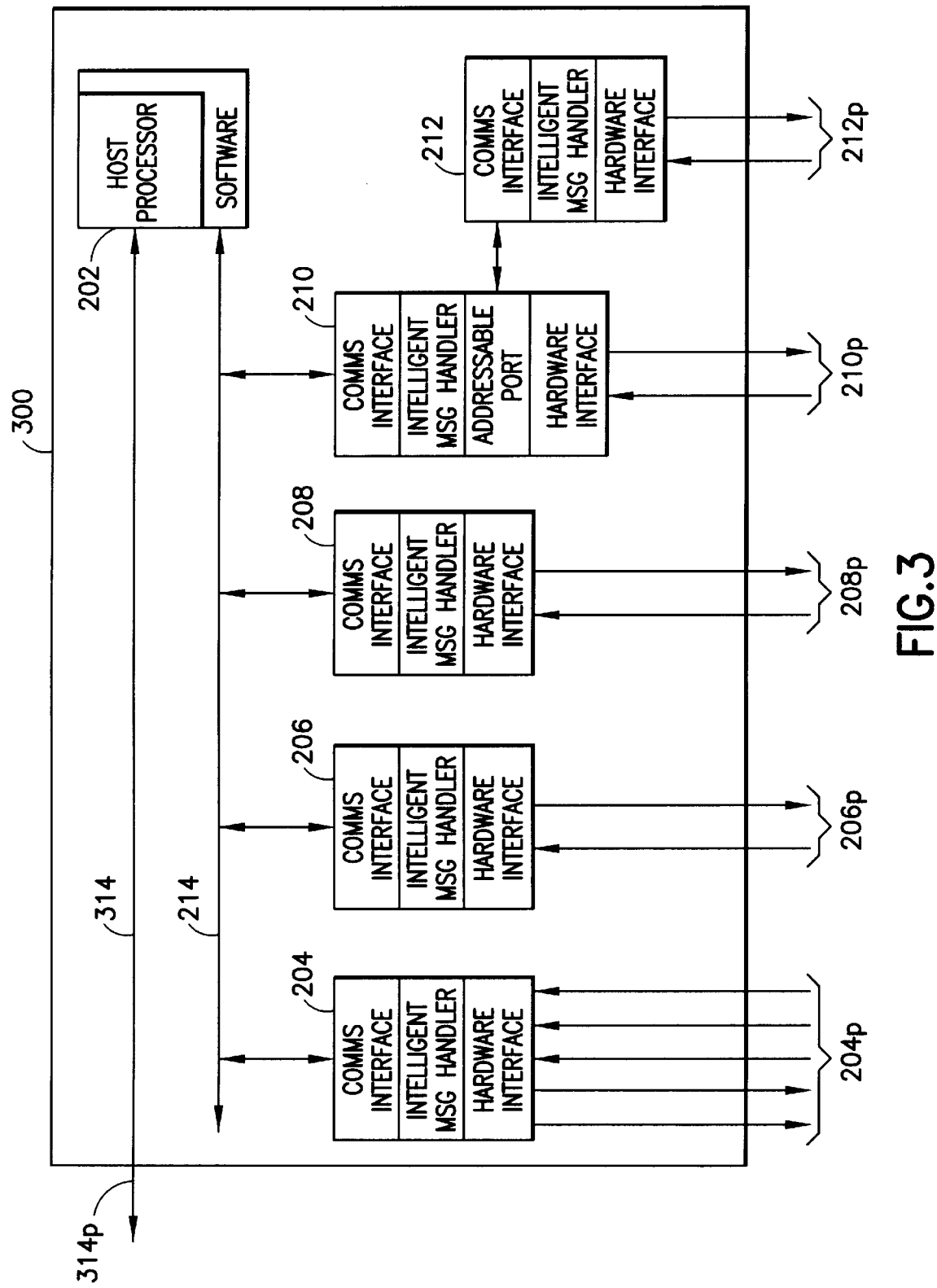
FIG. 3 is a diagram similar to FIG. 2 in which the host processor is also embodied on the same ASIC chip as the object oriented processors.

According to another embodiment of the invention, the ASIC chip may also be provided with an on-chip host processor. This embodiment is shown in FIG. 3 where the ASIC 300 is substantially the same as the ASIC 200 with the addition of an on-chip host processor 202. The ASIC 300 is also provided with a programming port 314p for programming the host processor for a specific application. Alternatively, the host processor may be pre-programmed with an on-chip ROM.

According to still another embodiment of the invention, a developer may design one or more custom object oriented processors for use in a discrete system and request custom ASIC chips containing the object oriented processors designed for a particular application.

As mentioned above, a new object oriented processor according to the invention includes one or more child ports with soft addressability. In addition, the invention provides several other improvements to the object oriented processors of the parent applications.

Figure 4B:
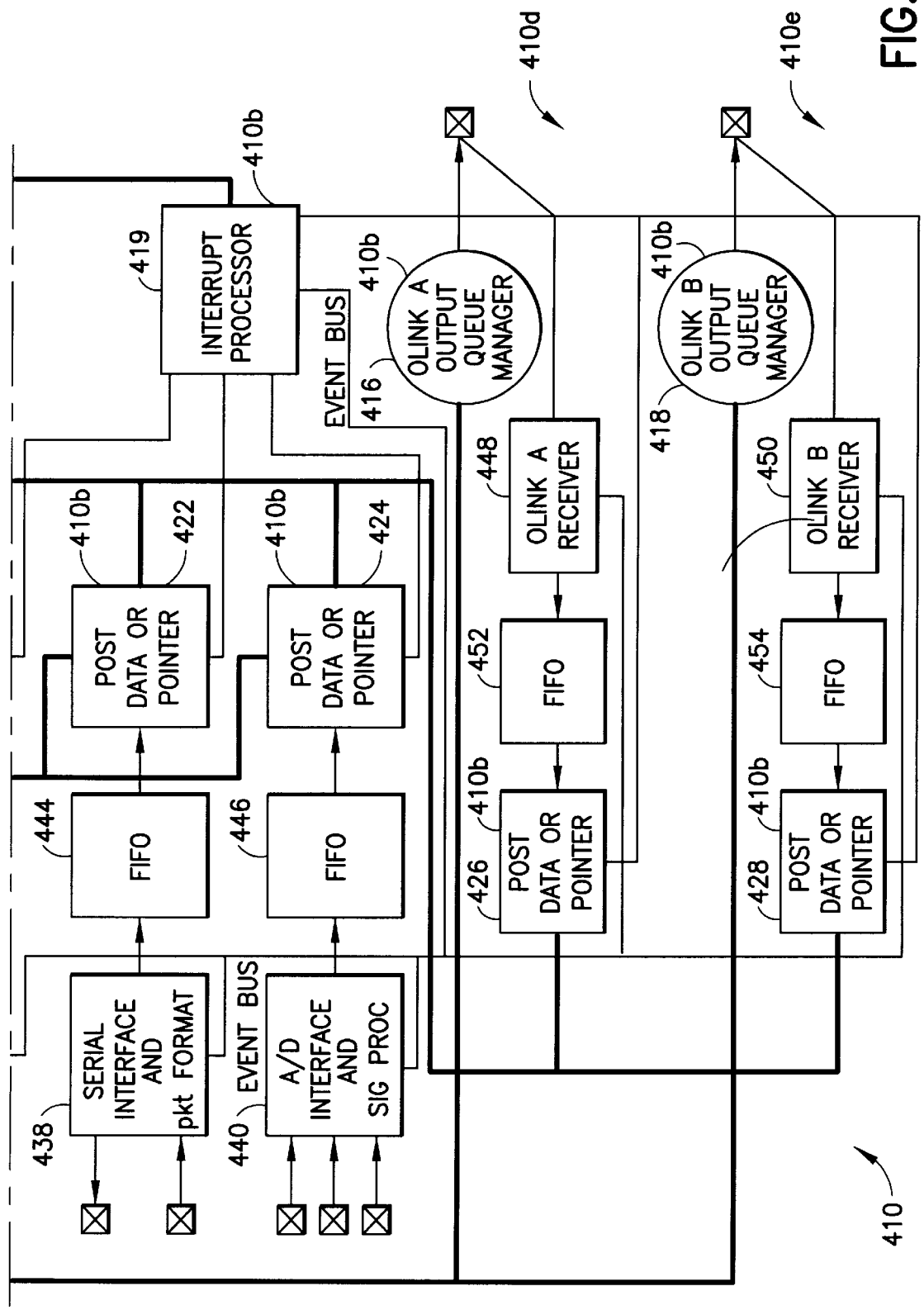
FIG. 4 is a schematic block diagram of a "parent" object oriented processor according to the invention with the enhanced Capability of an addressable port.

Turning now to FIG. 4, an object oriented processor 410 is shown which combines the functionality of several of the object oriented processors of FIG. 1 including the object oriented processor 110 with child ports with soft addressability. The object oriented processor 410 includes a comms interface 410a which is embodied here as a multi-master RS-485 interface. Accordingly, those skilled in the art will appreciate that the presently preferred communication bus is an RS-485 bus. The object oriented processor 410 includes an enhanced intelligent message handler and flow controller generally indicated by 410b which includes a state driven parser and database 412, an RS-485 output queue manager 414, an output queue manager 416, 418 for each addressable port, an interrupt processor 419, and an output gating function 420, 422, and 424 for each task specific functionality which is enabled to send messages and 426, 428 for each addressable port. The processor 410 is also provided with a task specific functionality in the form of a hardware interface 410c and two child ports with soft addressability 410d, 410e.

The hardware interface 410c generally includes an LCD port 430 for outputting data to an LCD, a parallel output port 432, a user output port 434, a keyboard input port 436, a serial input port 438 for a magnetic card reader or an IR remote control receiver, and an analog input port 440 with A/D conversion and signal processing. Each of the input ports 436, 438, 440 is provided with a FIFO buffer 442, 444, 446 for holding received data until it is send to the comms interface 410a. As shown in FIG. 4, data from the FIFOs 442, 444, 446 is released for transmission onto the bus by a corresponding output gating function 420, 422, 424.

Each of the child ports with soft addressability 410d, 410e generally includes a message receiver 448, 450 and an associated FIFO buffer 452, 454. As shown in FIG. 4, messages in the FIFOs 452, 454 is released for transmission onto the bus by a corresponding output gating function 426, 428. The message receivers 448, 450 take messages from child processors coupled to the child ports with soft addressability 410d, 410e and add the virtual fmAddr to the messages based on information in the database 412.

As seen in FIG. 4, all messages received from the bus by the processor 410 are first processed by the state driven parser and database 412. The database includes the assigned virtual addresses of the ports 410d, 410e as well as sufficient knowledge about the command language and the functionality of the processor to route incoming messages. The state driven parser and database 412, therefore, analyzes messages on the bus and determines whether the messages are intended for this processor 410 and where the messages should be routed within the processor 410. Thus, messages interpreted by the state driven parser and database 412 are appropriately forwarded to any one of the output ports 430, 432, 434, the child ports with soft addressability 410*d*, 410*e*, the interrupt processor 419, or the gating functions 420, 422, 424 of the input ports. When messages are forwarded to the child ports with soft addressability 410*d*, 410*e*, the messages are buffered by the output queue managers 416, 418.

Also as seen in FIG. 4, all messages destined for output onto the bus from the processor 410 are released onto the bus by the output queue manager 414. The output queue manager 414 services messages according to priority before sending them onto the bus. The priority of messages is determined by the interrupt processor 419 which is configurable by the host processor. As shown in FIG. 4, the interrupt processor 419 is coupled via an event bus to each of the input ports 436, 438, 440 and the addressable port receivers 448, 450 and the interrupt processor 419 is thereby advised each time new data or messages enter the processor 410 from functional layer or the child processors. Similarly, the interrupt processor 419 is coupled to each of the output gating functions 420, 422, 424, 426, 428 and the interrupt processor 419 decides when data in the various FIFOs 442, 444, 446, 452, 454 will be released to the output queue manager 414.

According to the presently preferred embodiment, the interrupt processor assigns a priority value of from 0–255 to each message it identifies via the event bus. The output queue manager 414 utilizes these priority values to determine the active output stream for messages placed on the bus by the processor 410. The manner in which the interrupt processor assigns a priority value can be configured by a message from the host or another processor which is routed to the interrupt processor by the state driven parser and database 412. In addition, according to the preferred embodiment, the interrupt processor is provided with a timer so that messages may be sent automatically by the processor 410 according to a schedule which is configured by the host or another processor. The timer may also be used to limit the frequency of unsolicited message packets.

From the foregoing discussion of FIG. 4, those skilled in the art will appreciate that the enhanced features of the processor 410 may also be applied to any of the object oriented processors described in the parent application and that these featured are not limited to use with a processor having the task specific functionality of the processor 410.

From all of the foregoing discussion, it will also be appreciated that the enhanced functionality of the object oriented processors described herein and the enhanced command language greatly relieves the host processor from much participation in the distributed processing system. Accordingly, the primary role of the host processor in the described embodiments is to initialize and configure the object oriented processors and to resolve error messages which appear on the bus. Thus, it will be appreciated that the specific functionality of the system developed according to the invention is primarily determined by which kinds of object orient processors are selected for inclusion in the system. Once the types and number of object orient processors are selected and coupled to the communications bus, the host is used to configure the system by providing specific parameters for each of the object orient processors at the time of system initialization. Therefore, it will be understood that in some systems, the functions of the host may be provided by a relatively simple processor containing the initial configurations of each of the object orient processors.

An exemplary command language vocabulary for the processor 410 includes commands for configuring and controlling an LCD, a keypad, an encoder, a serial interface, and an A/D interface, as well as commands to effect system functions such as reset. The vocabulary of the processor is stored in the state driven parser and database and is preferably organized according to classes and methods where classes refers to the general functionality such as LCD display, keyboard scanning, etc. and methods refers to specific functionality within a class such as writing a string to an LCD display, etc. The exemplary processor 410, therefore includes a vocabulary of six classes, the methods of which are show in the following Tables 1–6.

TABLE 1

| COMMAND | FUNCTION |
| --- | --- |
| CAp | Select active LCD where p is the number of the active LCD (a line of an LCD display) |
| CDxpq | Direct byte to LCD where x is the state of the RS line and pq is the byte to be sent |
| CF<string> | Custom font |
| CIxpq | Initialize wher x is the LCD module, p is the number of lines, and q is the width |
| CLpq | Cursor location where is pq is the column of an active line |
| CMp | String Write Mode where p= 0 = std line by line 1 = scroll bottom right to top left 2 = scroll top left to bottom right |
| CO | Display/Cursor/Blink On/Off |
| CS<string> | Write string |
| CX | Clear active LCD |
| CZ | Clear all displays |

Table 1 shows the commands for configuring and operating an LCD display which is attached to the LCD port 430 of the processor 410 shown in FIG. 4. It will be appreciated that many of these commands will include arguments or parameters. When the state driven parser and database 412 sees a command beginning with the upper case character C, it is immediately determined that the command is meant for the LCD controller. The first character of the command is defined as the class of the command and the second character of the command is defined as the method within the class.

TABLE 2

| KMx | Define mode x = 0 4x4 keypad, no encoder x = 1 4x2 keypad, single encoder |
| --- | --- |
| KR | Read KB buffer |
| KTpq | Set KB debounce time where pq is the debounce time in milliseconds |
| KIpq | Set keyboard interrupt priority wher pq is the priority 0–255 |

Table 2 shows the commands for configuring and reading a keypad which is attached to the keypad port 436 of the processor 410 shown in FIG. 4. It will be appreciated that the keypad may be configured in several ways and that some of the keyboard resources may be exchanged for encoder resources if mode of the keyboard is set to 4x2. When the state driven parser and database 412 sees a command beginning with the upper case character K, it is immediately determined that the command is meant for the keyboard controller. In particular, the KR command is directed to the gate function 420 to release buffered keyboard data to the output queue manager. Other keyboard configuration commands are directed to the interrupt processor 419.

TABLE 3

| | |
|---|---|
| EIpq | Set encoder interrupt priority where pq is the priority 0–255 |
| EPx | Read encoder position<br>x = 0 read do not reset counter<br>x = 1 read then reset counter |
| ER | Read encoder rate (detents per second) |
| ESx | Encoder saturation on/off |

Table 3 shows the commands for configuring and reading the optional encoder (when the keyboard is so configured). When the state driven parser and database 412 sees a command beginning with the upper case character E, it is immediately determined that the command is meant for the encoder.

TABLE 4

| | |
|---|---|
| SFpq | Define frame size (number of bits in a packet) where pq is the number of bits |
| SIpq | Set serial interface interrupt priority where pq is the priority 0–255 |

Table 4 shows the commands for configuring the serial port 438. When the state driven parser and database 412 sees a command beginning with the upper case character S, it is immediately determined that the command is meant for the interrupt processor 419 to define the parameters of the serial port 438.

TABLE 5

| | |
|---|---|
| AIpq | Set A/D interrupt priority where pq is the priority 0–255 |
| AMp | Set converter type where p is a type |
| ARpq | Read channel pq |
| AUpqrs | Set upper threshold for channel pq to be rs |
| ALpqrs | Set lower threshold for channel pq to be rs |
| AApq | Set the number of samples for signal averaging |
| ATpq | Set the measurement interval for signal averaging and threshold comparison |

Table 5 shows the commands for configuring and reading the A/D interface 440.

TABLE 6

| | |
|---|---|
| ZAx | Turn on/off acknowledge |
| ZCx | Turn on/off carriage return on packets |
| ZEx | Turn on/off error reporting |
| ZIx | Global interrupt enable/disable |
| ZPpqrs | Define objectLink child addresses<br>pq = 00 define virtual address of Olink port A<br>pq = 01 define virtual address of Olink port B<br>rs assigned address |
| ZN | Get object's name |
| ZZ | Soft reset |

Table 6 shows the commands for system functions and in particular includes the command for functionality interrogation {ZN} and the command for defining child addresses. The {ZN} command can be used by the host to automatically configure and operate new functionality added to a distributed processing.

From the foregoing, those skilled in the art will appreciate that a basic distributed processing system according to the invention may be installed with a plurality of parent object oriented processors for providing functions such as display, keypad input, card swipe input, analog data acquisition, etc. Child processors may then be removably coupled to parent processors where the child objects provide additional functionality such as speech output at different locations in the system. As additional child processors are added to the system, the host finds the child processors by scanning the network with the {ZN} command which is issued for each possible address on the network. A simple change in the host software enables all of the functionality of the newly added child processor. While additional functionality can be added to the system by adding additional parent processors which also respond to the {ZN} command, there are several advantages to using child processors when expanding the functionality of the system. The child processors do not require the same sophisticated message handling system that the parent requires. Also, the child processors do not require the RS-485 multi-master bus interface. For these two reasons, the child processors can be much less expensive than the parent processors. In addition, local communication between child processors or between child and parent processors is removed from the system bus.

With the foregoing in mind, an example of a distributed processing system according to the invention is a building management system which operates security features, fire alarm features, and environmental control features. In such a system, distributed parent processors could be provided for each of several strategic locations. Child processors having speech messaging may be attached to selected parent processors and addressed according to groups such as public areas, private areas, secure areas, etc. Environmental protection features can be easily added by providing child processors having data acquisition functions at appropriate locations. These child processors would provide signals relating to temperature, levels of pollutants, etc. The host processor could use this data to shut down or turn on various HVAC equipment, to signal voice messages at various locations in the system, etc.

As mentioned above, an object oriented processor according to the invention may be provided with a fully programmable functional layer wherein the exact functionality of the processor is determined by the developer. Such a processor would include a communications interface and intelligent message handling functions in the form of a shell such that the developer can define commands and message syntax to support the defined functionality of the programmable functional layer.

There have been described and illustrated herein several embodiments of methods and apparatus for distributed processing and rapid ASIC development. While particular embodiments of the invention have been described, it is not intended that the invention be limited thereto, as it is intended that the invention be as broad in scope as the art will allow and that the specification be read likewise. Thus, while particular communications buses have been disclosed, it will be appreciated that other buses could be utilized. Also, while specific exemplary high level command language messages have been shown, it will be recognized that the command language may be changed and/or expanded to accommodate different kinds of task specific functionality and different types of configuration variables. Moreover, while particular configurations have been disclosed in reference to the number and types of object oriented processors contained on a single ASIC chip, it will be appreciated that other configurations could be used as well. It will therefore be appreciated by those skilled in the art that yet other modifications could be made to the provided invention without deviating from its spirit and scope as so claimed.

What is claimed is:

1. A method for rapid development of ASIC chips utilizing distributed processing architecture comprising:
   a) designing a system of discrete components including a first host processor and at least one object oriented processor;
   b) providing a high level command language for communication between the first host processor and the at least one object oriented processor;
   c) coupling the first host processor to the at least one object oriented processor with a communications bus;
   d) programming the host processor with the high level command language to define a functionality of the system embodied as a first program;
   e) testing and debugging the system of discrete components;
   f) replicating the functionality of the at least one object oriented processor on an ASIC chip having an on-chip bus to which the replicated functionality is coupled;
   g) coupling one of the first host processor and a second host processor to the on-chip bus; and
   h) programming the host processor coupled to the on-chip bus with the first program.

2. A method according to claim 1, wherein:
   the at least one object oriented processor includes a plurality of object oriented processors.

3. A method according to claim 2, further comprising: 'i) assigning each of the plurality of object oriented processors a unique address via a high level command language message.

4. A method according to claim 3, wherein:
   said high level command language includes an addressing scheme for directing messages to a specific one of the plurality of object oriented processors.

5. A method according to claim 3, wherein:
   said high level command language includes an addressing scheme for directing messages to a specific sub-group of the plurality of object oriented processors.

6. A method according to claim 1, wherein:
   said step of designing a system of discrete components includes at least one child object oriented processor coupled to one of the at least one object orient processors, and
   said step of replicating the functionality of the at least one object oriented processor on an ASIC chip includes replicating the functionality of the at least one child object oriented processor on the ASIC chip and coupled to the replicated functionality of the one of the at least one object orient processors on the ASIC chip.

* * * * *